(12) United States Patent
Ahmed et al.

(10) Patent No.: US 9,441,298 B2
(45) Date of Patent: Sep. 13, 2016

(54) DEVICES INCLUDING METAL-SILICON CONTACTS USING INDIUM ARSENIDE FILMS AND APPARATUS AND METHODS

(71) Applicant: Applied Materials, Inc., Santa Clara, CA (US)

(72) Inventors: Khaled Z. Ahmed, Anaheim, CA (US); Prabu Gopalraja, San Jose, CA (US); Atif Noori, Saratoga, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/939,202

(22) Filed: Nov. 12, 2015

(65) Prior Publication Data
US 2016/0068962 A1    Mar. 10, 2016

Related U.S. Application Data

(62) Division of application No. 13/748,910, filed on Jan. 24, 2013, now Pat. No. 9,190,320.

(60) Provisional application No. 61/591,066, filed on Jan. 26, 2012, provisional application No. 61/595,371, filed on Feb. 6, 2012.

(51) Int. Cl.
| | |
|---|---|
| H01L 21/44 | (2006.01) |
| C23C 16/52 | (2006.01) |
| H01L 21/768 | (2006.01) |
| H01L 21/67 | (2006.01) |
| H01L 23/482 | (2006.01) |
| H01L 29/772 | (2006.01) |
| H01L 21/285 | (2006.01) |
| C23C 14/22 | (2006.01) |

(Continued)

(52) U.S. Cl.
CPC .............. *C23C 16/52* (2013.01); *C23C 14/22* (2013.01); *C23C 16/0227* (2013.01); *C23C 16/45544* (2013.01); *H01L 21/28525* (2013.01); *H01L 21/6715* (2013.01); *H01L 21/6719* (2013.01); *H01L 21/67207* (2013.01); *H01L 21/76843* (2013.01); *H01L 23/4827* (2013.01); *H01L 29/772* (2013.01); *H01L 2924/0002* (2013.01)

(58) Field of Classification Search
CPC .................................................... H01L 23/4827
USPC ......................................... 438/652, 459, 977
See application file for complete search history.

(56) References Cited

U.S. PATENT DOCUMENTS

| | | |
|---|---|---|
| 4,888,303 A | 12/1989 | Quinlan |
| 5,232,873 A | 8/1993 | Geva et al. |

(Continued)

OTHER PUBLICATIONS

PCT International Preliminary Report on Patentability in PCT/US2013/022915, mailed Aug. 7, 2014, 9 pages.

(Continued)

*Primary Examiner* — Samuel Gebremariam
(74) *Attorney, Agent, or Firm* — Servilla Whitney LLC

(57) ABSTRACT

Described are apparatus and methods for forming films comprise indium and arsenic. In particular, these films may be formed in a configuration of two or more chambers under "load lock" conditions. These films may include additional components as dopants, such as aluminum and/or gallium. Such films can be used in metal/silicon contacts having low contact resistances. Also disclosed are devices including the films comprising indium arsenide.

9 Claims, 5 Drawing Sheets

(51) Int. Cl.
  *C23C 16/02* (2006.01)
  *C23C 16/455* (2006.01)

(56) References Cited

U.S. PATENT DOCUMENTS 7,368,368 B2   5/2008   Emerson
7,518,196 B2   4/2009   Chau et al.
2001/0013313 A1   8/2001   Droopad et al.
2004/0115891 A1   6/2004   Gris
2010/0255661 A1   10/2010   Vatus et al.

OTHER PUBLICATIONS

PCT International Search Report and Written Opinion in PCT/US2013/022915, mailed May 30, 2013, 13 pgs.

DEVICES INCLUDING METAL-SILICON CONTACTS USING INDIUM ARSENIDE FILMS AND APPARATUS AND METHODS

CROSS-REFERENCE TO RELATED APPLICATIONS

This application is a divisional under 35 U.S.C. §120 of U.S. patent application Ser. No. 13/748,910, filed Jan. 24, 2013, which claims the benefit under 35 U.S.C. §119(e) to U.S. Provisional Application No. 61/591,066, filed Jan. 26, 2012, and U.S. Provisional Application No. 61/595,371, filed Feb. 6, 2012, the entire contents of each are incorporated herein by reference.

FIELD

Embodiments of the present invention generally relate to the field of semiconductor manufacturing processes and devices, particularly to apparatus and methods for forming devices such as field effect transistors including indium arsenide films providing low contact resistivity.

BACKGROUND

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

An exemplary FET or MOSFET includes a gate electrode on a gate dielectric layer on a surface of a silicon substrate. Source/drain regions are provided along opposite sides of the gate electrode. The source and drain regions are heavily doped regions of the silicon substrate. Usually a silicide layer, for example, nickel silicide is used to couple contacts in an interlayer dielectric to the source and drain regions.

The contact resistance associated to the silicide/silicon interface is one of the biggest challenges to solve in order to preserve drive current capabilities. The required contact resistivity of ultra-thin silicide on silicon source/drain of the transistor beyond the 22 nm node needs to be below $4\times10^{-9}$ ohm-cm$^2$. However, nickel silicide (NiSi), currently the most widely accepted alloy, has a contact resistivity on the order of $1\times10^{-8}$ ohm-cm$^2$.

Different contact schemes have been developed to achieve low effective Schottky barrier height (SBH) between metal and silicon source/drain diffusion regions. One such method involves inserting an interfacial oxide between metal and silicon to reduce the density of metal-induced gap states (MIGS). Another method involves SBH tuning by interfacial $SiO_2$ or high-K dielectric induced dipoles. However, insertion of a high bandgap oxide with a large conduction band offset results in large tunnel resistivity and would offset the positive effect of Fermi unpinning.

Thus, there is a need for new contact schemes that provide contact resistivities below $1\times10^{-8}$ ohm-cm$^2$.

SUMMARY OF THE INVENTION

One aspect of the present invention pertains to a substrate processing apparatus. In embodiments of this aspect, the apparatus comprises a first processing chamber to clean a substrate to provide a cleaned substrate; a second processing chamber in communication with the first processing chamber to deposit a layer comprising indium arsenide on the cleaned substrate; a third processing chamber in communication with the second processing chamber to deposit a metal layer on the layer comprising indium arsenide; and a control system in communication with the first, second and third processing chambers, wherein the first, second and third processing chambers are in communication under load lock conditions.

In some embodiments, the first processing chamber may be an atomic hydrogen cleaning chamber or a Siconi™ chamber or similar chamber.

In one or more embodiments, the second processing chamber is an atomic layer deposition (ALD) chamber, physical vapor deposition (PVD) chamber, chemical vapor deposition (CVD) chamber or molecular beam epitaxy (MBE) chamber. In some embodiments, the second processing chamber is an ALD chamber. In some embodiments, the second processing chamber is a sputtering chamber. The second processing chamber may further comprise a power source to maintain a specific temperature in the process area, such as in the range from about 350° C. to about 500° C.

According to one or more embodiments of this aspect, the indium arsenide layer has a predetermined thickness. In some embodiments, the predetermined thickness of the indium arsenide layer is selected to optimize contact resistivity with an underlying substrate surface. One or more embodiments provide that the predetermined thickness is selected to provide a contact resistivity below $1\times10^{-8}$ ohm-cm$^2$. In some embodiments, the predetermined thickness is selected to provide a contact resistivity $4\times10^{-9}$ ohm-cm$^2$. According to one or more embodiments, the predetermined thickness is in the range from about 0.5 nm to about 2 nm.

The indium arsenide layer may also include additional components, such as gallium, aluminum, antimony, phosphorus or other dopants.

In one or more embodiments, the control system comprises a CPU and a computer-readable medium having stored thereon a set of machine-executable instructions that, when executed by the CPU, cause the apparatus to perform a method comprising: cleaning a surface of the substrate to provide a cleaned substrate; moving the cleaned substrate from the first processing chamber to a transfer chamber; moving the cleaned substrate from the transfer chamber to the second processing chamber; depositing an indium arsenide film on the cleaned substrate; moving the substrate having the indium arsenide film thereon from the second processing chamber to a transfer chamber; moving the substrate having the indium arsenide film thereon from the transfer chamber to the third processing chamber; and depositing a metal film on the indium arsenide film.

Another aspect of the invention provides a method of forming contacts on a substrate, the method comprising: cleaning a surface of a substrate to provide a cleaned substrate; depositing an indium arsenide layer on the cleaned substrate; and depositing a metal layer on the indium arsenide layer, wherein the substrate is not exposed to air between cleaning and the indium arsenide deposition and between the indium arsenide deposition and the metal layer deposition. In one or more embodiments, the substrate having an indium arsenide layer thereon is treated by rapid thermal processing, either before and/or after depositing the metal layer on the indium arsenide layer. In various embodiments, the indium arsenide layer further comprises additional components such as gallium and/or aluminum and/or other dopants.

According to one or more embodiments of this method, the indium arsenide layer has a predetermined thickness. In some embodiments, the predetermined thickness of the indium arsenide layer is selected to optimize contact resistivity with an underlying substrate surface. One or more embodiments provide that the predetermined thickness is selected to provide a contact resistivity below $1\times10^{-8}$ ohm-cm$^2$. In some embodiments, the predetermined thickness is selected to provide a contact resistivity $4\times10^{-9}$ ohm-cm$^2$. According to one or more embodiments, the predetermined thickness is in the range from about 0.5 nm to about 2 nm.

Yet another aspect of the invention provides a device comprising: a substrate including a surface; an In(Ga)As layer on the surface of the substrate, and a metal layer on the In(Ga)As layer. In some embodiments, the In(Ga)As layer has a thickness in the range from about 0.5 nm to about 3 nm.

In embodiments of this aspect, the metal layer is a contact and the device has a contact resistivity below $10^{-8}$ ohm-cm$^2$. In a specific embodiment, the contact resistivity is below $4\times10^{-9}$ ohm-cm$^2$.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
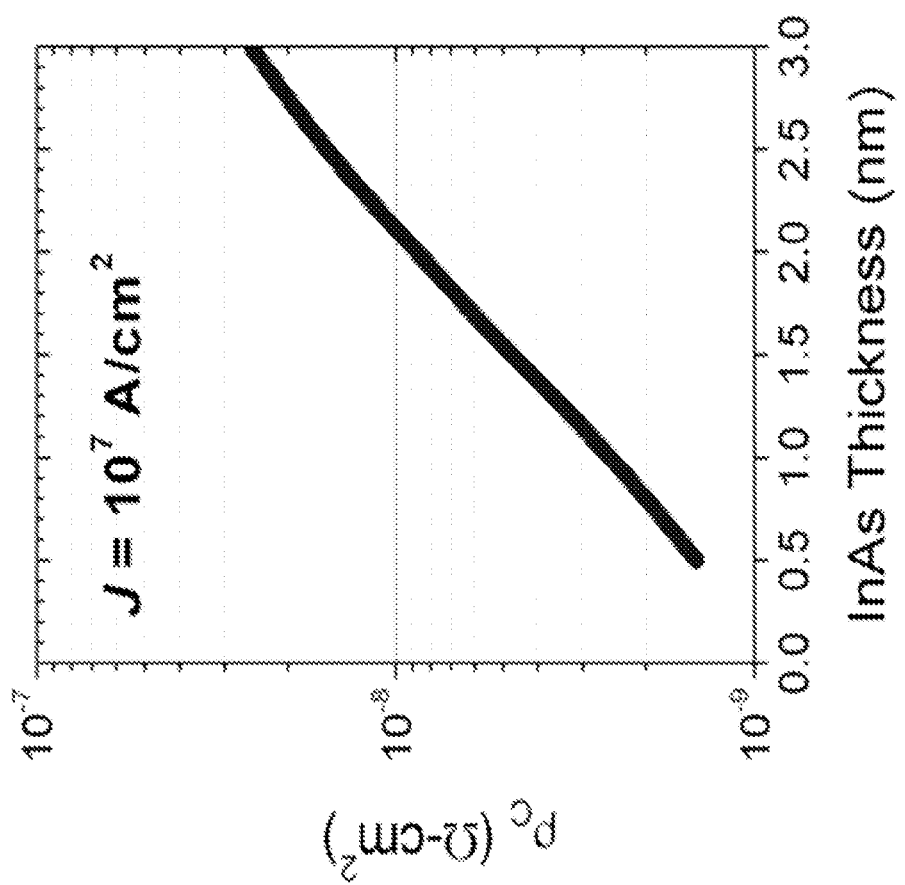
FIG. 1 shows a graph of the calculated contact resistivity of InAs films of varying thicknesses.

It has been found that using indium arsenide (InAs) films as an interfacial layer in transistor contacts provides contact resistivities below $1\times10^{-8}$ ohm-cm$^2$. Thus, various embodiments described herein provide methods and apparatuses for the forming thin InAs layers on a substrate surface.

As used herein, a "substrate surface," refers to any substrate or material surface formed on a substrate upon which film processing is performed during a fabrication process. For example, a substrate surface on which processing can be performed include materials such as silicon, silicon oxide, strained silicon, silicon germanium, silicon carbide, silicon on insulator (SOI), carbon doped silicon oxides, silicon nitride, doped silicon, germanium, gallium arsenide, indium arsenide, indium gallium arsenide, indium aluminum arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, silicon carbide, doped or undoped polysilicon, doped or undoped silicon wafers, III-V materials such as GaAs, GaN, InP, etc., indium arsenide containing substrates such as indium arsenide, indium gallium arsenide, indium aluminum arsenide, etc, and patterned or non-patterned wafers. Substrates may be exposed to a pretreatment process to polish, etch, reduce, oxidize, hydroxylate, anneal and/or bake the substrate surface.

According to one or more embodiments, the substrate includes silicon. In some embodiments, the substrate is n-doped silicon. Other substrate materials may also be used, including, but not limited to, those described above.

In order to study the transport through the InAs/n-Si heterostructure and to compare it with NiSi/n-Si with pinned Fermi level, a numerical solver based on the transfer-matrix method was developed to calculate the transmission probability of an electron through the tunneling barrier. The formula for the current through the metal/InAs/Si structure is provided as Formula (I) below:

$$J = \frac{qm^*kT}{2\pi^2 h^3} \int_{E_C}^{\infty} dE\, T(E) \ln\left\{ \frac{\exp\left(\frac{E_{Fs}-E_C-E}{kT}\right)+1}{\exp\left(\frac{E_{Fm}-E_C-E}{kT}\right)+1} \right\} \quad (I)$$

wherein J is the current density, q is the charge of an electron, k is Boltzmann's constant, h is the reduced Planck's constant, $E_{Fs}$ and $E_{Fm}$ is the Fermi level in the semiconductor and the metal respectively, $E_C$ is the conduction band edge of the semiconductor, m* is the tunneling effective mass, and T is the temperature.

The structure was simulated using a Schrödinger-Poisson solver, which accounts for quantization in the ultrathin InAs and silicon. The amount of InAs bandgap increase due to biaxial strain was calculated using the deformation potential and the strain tensor. Next, the simulated potential profile from the Schrödinger-Poisson solver was input into the numerical solver for calculating the transmission probability using the transfer matrix method. The obtained transmission probability as a function of energy was integrated and multiplied by the Fermi occupancy factor on either side of the tunnel barrier to calculate the current density J. The current density J was determined as a function of voltage V for different InAs film thicknesses.

The contact resistivity $\rho_c$ was calculated according to Formula (II) below:

$$\rho_c = dV/dJ \quad (II)$$

FIG. 1 shows the calculated $\rho_c$ as function of InAs thickness at a current density of $10^7$ A/cm$^2$. As can be seen from FIG. 1, low thicknesses of InAs are predicted to have low contact resistivities. In particular, the simulations of the new InAs contact scheme show that contact resistivities near $1\times10^{-9}$ ohm-cm$^2$ are possible.

Accordingly, one aspect of the invention relates to a method of forming an InAs layer on a substrate surface. In embodiments of this aspect, the method comprises controlling deposition of an indium arsenide layer on a substrate surface to provide an indium arsenide layer having a predetermined thickness to optimize contact resistivity with the underlying substrate. In one or more embodiments, the indium arsenide layer may comprise additional components such as gallium. An indium arsenide layer that optionally includes gallium will be designated as an In(Ga)As layer. The In(Ga)As layer does not necessarily include gallium, and may include additional components besides indium and arsenic. Other dopants may include aluminum, antimony or phosphorus, among others. In various embodiments, the In(Ga)As layer comprises at least 20%, 30%, 40%, 50%, 60%, 70%, 80%, 90%, 95%, 96%, 97%, 98%, 99%, 99.5% or 99.9% indium and arsenic. In various other embodiments, the In(Ga)As layer comprises at least 20%, 30%, 40%, 50%, 60%, 70%, 80%, 90%, 95%, 96%, 97%, 98%, 99%, 99.5% or 99.9% indium, gallium and arsenic.

One or more embodiments provide that the In(Ga)As layer has a predetermined thickness to provide a contact resistivity below $10^{-8}$ ohm-cm$^2$. In some embodiments, In(Ga)As layer has a predetermined thickness to provide a contact resistivity below $4\times10^{-9}$ ohm-cm$^2$. In some embodiments, the predetermined thickness of the In(Ga)As layer is in the range from about 0.5 nm to about 3 nm. In some embodiments, the predetermined thickness of the In(Ga)As layer is in the range from about 0.5 nm to about 2 nm. According to one or more embodiments, the predetermined thickness of the InAs layer is in the range from about 1 nm to about 2 nm.

In one or more embodiments, the method is performed under vacuum conditions, i.e. under reduced pressure and without exposing the substrate to ambient air. In one or more embodiments, this method may be performed as an atomic layer deposition (ALD) process, molecular beam epitaxy (MBE) process, chemical vapor deposition (CVD) epitaxy process, or physical vapor deposition (PVD) process.

In a typical ALD process, alternating pulses or flows of "A" precursor and "B" precursor can be used to deposit a film, for example, in a pulsed delivery of multiple cycles of pulsed precursors and co-reactants, for example, A precursor pulse, B precursor pulse, A precursor pulse, B precursor pulse, A precursor pulse, B precursor pulse, etc. The alternating exposure of the surface to reactants "A" and "B" is continued until the desired thickness film is reached. However, instead of pulsing the reactants, the gases can flow simultaneously from a gas delivery head or nozzle and the substrate and/or gas delivery head can be moved such that the substrate is sequentially exposed to the gases. Of course, the aforementioned ALD cycles are merely exemplary of a wide variety of ALD process cycles in which a deposited layer is formed by alternating layers of precursors and co-reactants.

Exemplary indium and arsenic precursors include, but are not limited to, trimethyl indium and arsine, respectively. If the In(Ga)As film also includes gallium, a gallium precursor such as trimethyl gallium may be used.

In some embodiments, the PVD process is a sputtering process. One or more embodiments provide that other components, such as silicon, are co-sputtered with the In(Ga)As.

According to one or more embodiments, the substrate is subjected to further processing after forming the In(Ga)As layer. This further processing can be performed in the same chamber as the In(Ga)As film chamber, or can be performed in one or more separate processing chambers. In some embodiments, the substrate having the In(Ga)As film thereon is moved from the first chamber to a separate, second chamber for further processing. The substrate having the In(Ga)As film thereon can be moved directly from the first chamber to the separate processing chamber, or it can be moved from the first chamber to one or more transfer chambers, and then moved to the desired separate processing chamber.

According to one or more embodiments, the substrate having the In(Ga)As film thereon is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the In(Ga)As layer on the surface of the substrate. According to one or more embodiments, a purge gas is injected at the exit of the In(Ga)As formation chamber to prevent reactants from moving from the In(Ga)As formation chamber to the transfer chamber and/or processing chamber. Thus, the flow of inert gas forms a curtain at the exit of the chamber.

Other processing chambers can include, but are not limited to, deposition chambers, etching chambers, and rapid thermal processing (RTP) chambers. According to one or more embodiments, the substrate surface is cleaned or etched before depositing the In(Ga)As layer. Some embodiments provide a metal film is deposited on the In(Ga)As layer by a deposition process, such as chemical vapor deposition (CVD) or atomic layer deposition (ALD). In some embodiments, a metal film is deposited on the In(Ga)As layer via an atomic layer deposition process. In one or more embodiments, the deposited metal comprises Ti, TiN, Ta, TaN, W, WN, Mo, TiAl or combinations, composites or alloys thereof.

In one exemplary process, the substrate is etched, an In(Ga)As layer having a predetermined thickness is deposited on the etched substrate, and then a metal film is deposited on the In(Ga)As layer. In another exemplary process, the substrate is etched, an In(Ga)As layer having a predetermined thickness is deposited on the etched substrate, the In(Ga)As layer is annealed by rapid thermal processing, and then a metal film is deposited on the In(Ga)As layer. Such rapid thermal processing may recrystallize the In(Ga)As layer, and can be used to tune the energy gap properties of the In(Ga)As layer. According to one or more embodiments, the rapid thermal processing is performed at a temperature in the range from about 200° C. to about 1000° C.

Another aspect of the invention relates to a method of forming contacts on a substrate, the method comprising exposing a surface of the substrate to an indium precursor and an arsenic precursor to form an In(Ga)As layer on the surface of the substrate, and depositing a metal layer on the In(Ga)As layer. In embodiments of this aspect, the In(Ga)As layer has a thickness in the range from about 0.5 nm to about 3 nm. In some embodiments, the predetermined thickness of the In(Ga)As layer is in the range from about 0.5 nm to about 2 nm. According to one or more embodiments, the predetermined thickness of the In(Ga)As layer is in the range from about 1 nm to about 2 nm.

According to one or more embodiments, the substrate is not exposed to air between the In(Ga)As formation step and the metal layer deposition step. As such, the In(Ga)As layer does not oxide and will remain ultrathin. In one or embodiments, the In(Ga)As layer is formed via an ALD, PVD, CVD or MBE process. In some embodiments, the In(Ga)As layer is formed via a sputtering process and the metal layer is formed via an atomic layer deposition process. In some embodiments, both the In(Ga)As layer and metal layer are formed via ALD processes.

Yet another aspect of the invention pertains to an apparatus for performing a process according to any of the embodiments described above. In particular, provided is an apparatus for forming contacts on a substrate surface. One embodiment relates to an apparatus comprising a chamber having a wall defining a process area including a substrate support, an In(Ga)As target, a power source and a control system.

Figure 2:
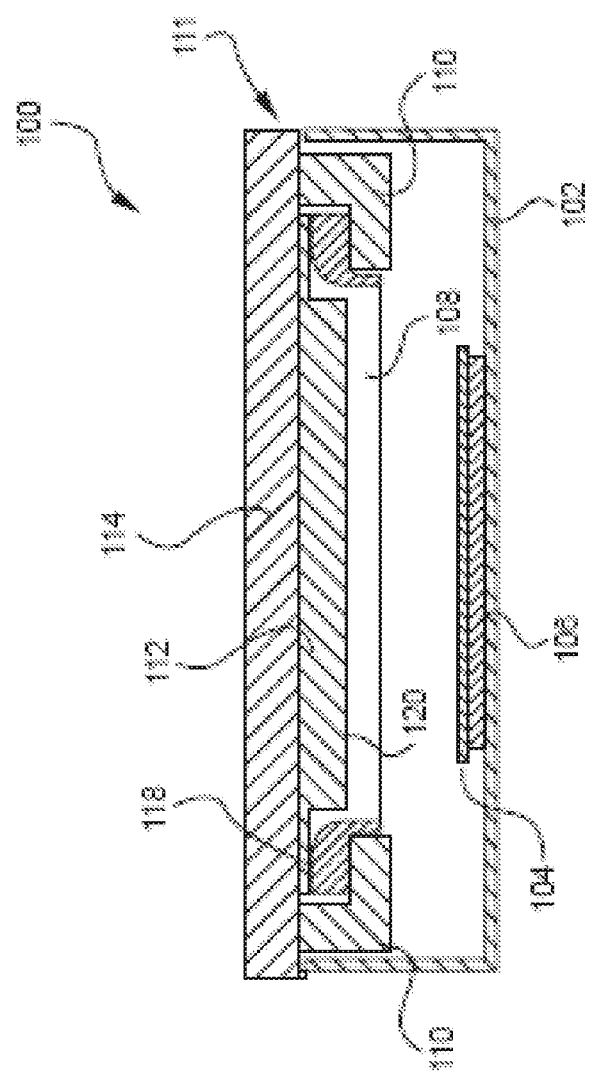
FIG. 2 illustrates a schematic of an apparatus in accordance with one or more embodiments of the invention.

FIG. 2 illustrates one embodiment in accordance with this aspect of the invention. A semiconductor fabrication chamber 100 comprising a chamber body 102 and a substrate 104 supported by a substrate support 106 within the chamber body 102. A target assembly 111 includes a target 112 supported by a backing plate 114. The target includes a front face or sputterable area 120 of disposed in a spaced relationship with respect to the substrate support 106. A shield 108 comprising a generally annular shaped metal ring extends circumferentially around the target. The shield 108 is held in place in the chamber by a shield support 110. The apparatus may include a transfer valve (not shown) in the chamber wall to move a substrate from the process area to a transfer chamber under controlled pressure to prevent exposure of the substrate to ambient air.

A process gas is introduced into the chamber 100 via a gas delivery system that typically includes a process gas supply (not shown) including one or more gas sources that feed one or more gas conduits that allow gas to flow into the chamber via a gas inlet that is typically an opening in one of the walls of the chamber. The process gas may comprise a non-reactive gas, such as argon, krypton or xenon that energetically impinges upon and sputters material from a target 112. The target 112 is electrically isolated from the chamber 100 and is connected to a target power supply (not shown), for example, an RF power source, a DC power source, a pulsed DC power source, or a combined power source that uses RF power and/or DC power or pulsed DC power. In one embodiment, the target power source applies negative voltage to the target 112 energizing the process gas to sputter material from the target 112 and onto the substrate 104.

According to one or more embodiments, the target 112 comprises In(Ga)As, such that the material sputtered from the target 112 forms an In(Ga)As layer on the substrate 104. The target 112 may also contain other components, which may be co-sputtered with the In(Ga)As. In some embodiments, an In(Ga)As target 112 further comprises silicon, such that In(Ga)As and silicon are co-sputtered onto the surface of substrate 104.

According to one or more embodiments, the power source maintains a temperature in the process area from about 350° C. to about 500° C. In some embodiments, the power source maintains a temperature in the process area from about 400° C. to about 450° C.

In one or more embodiments, the apparatus may comprise an exhaust port in fluid communication with an exhaust system, which exhaust and control the pressure of the process gas in the chamber 100.

In one or more embodiments, various elements of the apparatus such as the power source and exhaust system are controlled by the chamber controller (not shown), which provides I/O control of the apparatus. In some embodiments, the chamber controller communicates with the various other control elements to control the thickness of the In(Ga)As layer. The chamber controller may control one or more factors that influence the thickness of the In(Ga)As layer, such as the temperature and/or pressure in the process area.

In some embodiments, this predetermined thickness is related to a desired property of the film, such as having a contact resistivity below a certain value. Thus, the predetermined thickness may be selected to optimize contact resistivity with an underlying substrate surface. For example, the predetermined thickness may be selected to provide a contact resistivity below $10^{-8}$ ohm-cm$^2$. In other embodiments, the predetermined thickness may be selected to provide a contact resistivity below $4 \times 10^{-9}$ ohm-cm$^2$. According to one or more embodiments, the predetermined thickness of the In(Ga)As layer is in the range from about 0.5 nm to about 3 nm. In some embodiments, the predetermined thickness of the In(Ga)As layer is in the range from about 1 nm to about 2 nm.

The chamber controller can include a CPU, a memory and an I/O in wired or wireless communication with the various controllers. The CPU sends and receives signals to the power source to control the deposition of the In(Ga)As film. The CPU 234 also sends and receives signals to the exhaust system to control flow of exhaust from the chamber and control pressure in the substrate process area.

Another embodiment of an apparatus for depositing an In(Ga)As film comprises a chamber body, a wafer support, one or more injectors, a pressure control valve, a control system, and a transfer valve. This apparatus will provide a supply of indium precursor and arsenic precursor to the substrate surface to deposit an In(Ga)As film on the substrate.

Figure 5:
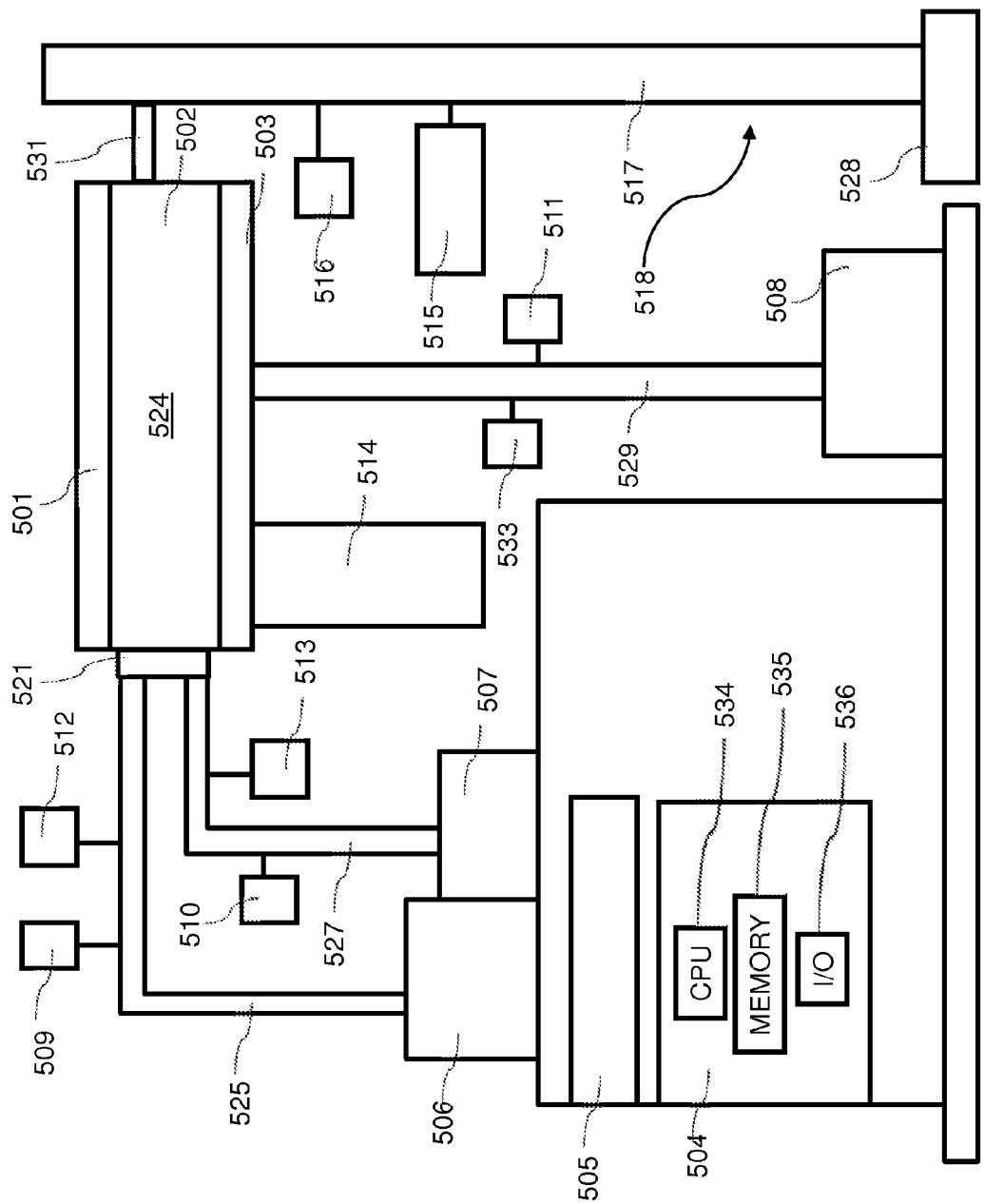
FIG. 5 illustrates a schematic of an apparatus in accordance with one or more embodiments of the invention.

FIG. 5 illustrates one embodiment in accordance with this aspect of the invention. Chamber body includes a chamber lid 501, chamber wall 502, and a chamber plate 503. Chamber lid 501, chamber wall 502 and chamber plate 503 define a substrate process area 524 where the deposition reaction occurs on a substrate surface. Lifting mechanism 514 raises and lowers the substrate so that the substrate can be moved in and out of the substrate process area with a robot blade or other suitable transfer mechanism. The apparatus may include a transfer valve (not shown) to move a substrate from the process area to a transfer chamber under controlled pressure to prevent exposure of the substrate to ambient air.

An indium precursor is provided by indium precursor supply 506, which is delivered into the process area 524 via indium conduit 525, which can be any suitable conduit such as piping or channel to deliver ammonia at an appropriate flow rate to the process area 524 through injector 521. The indium precursor and arsenic precursor may be dispersed from the same injector, or multiple injectors may be used to prevent mixing before reaching the substrate process area. Any appropriate flow configuration may be used for flowing the precursors into the substrate process area, including cross flow or top-down flow. The injectors 521 may comprise any means for dispersing the reactants into the substrate process area, including a showerhead or baffle plate The indium and arsenic precursor supplies can be any suitable sources of the precursors, including a cylinder of the precursor gas or a generation system to generate the precursor gas. The flow of indium precursor gas to the chamber is regulated by indium precursor valve 509 and indium precursor flow controller 512, which can communicate with chamber controller 504. The flow controller 512 can be a mass flow or volume flow controller. An arsenic precursor is provided by arsenic precursor supply 507 and delivered to the process area 524 via conduit 527 through the injector 521. The flow of arsenic precursor is regulated by arsenic precursor valve 510 and arsenic precursor controller 513, which can be a mass flow or volume flow controller. Valve 510 and flow controller 513 can be in communication with chamber controller 504. As shown in FIG. 2, the indium precursor and arsenide precursor may be delivered to the chamber separately via separate conduits 525 and 527. However, it is within the scope of the invention to mix the precursors prior to introducing the gases into the chamber, and deliver them in a single conduit.

If the In(Ga)As layer comprises gallium, a gallium precursor may also be delivered to the chamber using a similar precursor supply, conduit and injector configuration. Other dopants may be delivered in a similar manner.

An inert gas supply 508 can be used to provide an inert gas as a purge gas via inert gas conduit 529 to remove reactants and/or byproducts from the chamber body via the exhaust system 518. In addition, the inert gas can be used as a carrier gas to deliver reactants into the chamber by mixing the inert gas with one or both the indium precursor supply or the arsenic precursor supply. If the inert gas is to be used as a carrier gas, the inert gas conduit would include appropriate interconnects (not shown) to connect inert gas conduit 529 with one or both of indium precursor gas conduit 525 and/or arsenic precursor conduit 527. Appropriate interconnects would include valves and/or flow controllers (not shown) that would be in communication with chamber controller 504. Inert gas valve 511 regulates the flow of inert gas to the chamber body. A flow controller 533 may also be used to regulate the flow of inert gas into the chamber A temperature controller 505 may control the various heating and cooling elements of the apparatus, such as heating and/or cooling elements for the chamber plate 503.

In one or more embodiments, the apparatus may comprise an exhaust system 518 for removing gases from the chamber body. A pump 528 in flow communication with exhaust line 517 connected to the chamber via exhaust conduit 531 removes excess reactants and byproducts of the In(Ga)As film formation process from the process area 524 when the film has been deposited. An isolation valve 516 can be used to isolate the chamber body from the pump 528. A throttle valve 515 can be used to regulate the pressure in the chamber body to achieve the desired pressure in the process area 524.

In one or more embodiments, various elements of the apparatus such as the indium precursor flow controller 512, the arsenic precursor flow controller 513, and the temperature controller 505 are controlled by the chamber controller 504, which provides I/O control of the apparatus. In some embodiments, the chamber controller 504 communicates with the various other control elements to control the thickness of the In(Ga)As layer. The chamber controller 504 may control the quantity of precursors delivered to the process chamber area, such that the In(Ga)As layer formed has a predetermined thickness. The chamber controller 504 may also control other factors that influence the thickness of the In(Ga)As layer, such as the temperature and/or pressure in the process area.

The chamber controller 504 can include a CPU 534, a memory 535 and an I/O 536 in wired or wireless communication with the various controllers. The CPU 534 sends and receives signals to the indium precursor flow controller 512 and the arsenic precursor flow controller 513 to control the flow of indium precursor and arsenic precursor to the injector 521. The CPU 534 also sends and receives signals to the throttle valve 515 to control pressure in the substrate process area so that the throttle valve 515 operates as a pressure control valve for the apparatus. The CPU 534 can also be in communication with the isolation valve 516 and pump 528 to further control the flow of exhaust from the chamber.

The CPU for any of the apparatus described herein may be one of any forms of a computer processor that can be used in an industrial setting for controlling various chambers and sub-processors. Thus, the CPU can be coupled to the memory which may be one or more of readily available memory such as random access memory (RAM), read only memory (ROM), flash memory, compact disc, floppy disk, hard disk, or any other form of local or remote digital storage. Support circuits (not shown) can be coupled to the CPU to support the CPU in a conventional manner. These circuits include cache, power supplies, clock circuits, input/output circuitry, subsystems, and the like. The CPU and the memory are coupled to an appropriate I/O circuit to communicate with the various controllers of the apparatus.

The control system may further a computer-readable medium having a set of machine-executable instructions. These instructions may be such that, when executed by the CPU, cause the apparatus to perform any of the methods previously described. In one embodiment, the instructions relate to a method comprising depositing an In(Ga)As film having a predetermined thickness on a surface of a substrate; moving the substrate having the In(Ga)As film thereon from the process area to a transfer chamber; moving the substrate having the In(Ga)As film thereon from the transfer chamber to a deposition chamber; and depositing a metal film on the In(Ga)As film.

The apparatus may further comprise other chambers in addition to the In(Ga)As film formation chamber. These chambers can include transfer chambers and additional processing chambers, such as deposition chambers and etching chambers. These chambers may be interconnected in a "cluster tool system."

Generally, a cluster tool is a modular system comprising multiple chambers which perform various functions including substrate center-finding and orientation, degassing, annealing, deposition and/or etching. According to an embodiment of the present invention, a cluster tool includes at least a first chamber configured to deposit the In(Ga)As film. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing some steps of a process as described herein.

Figure 3:
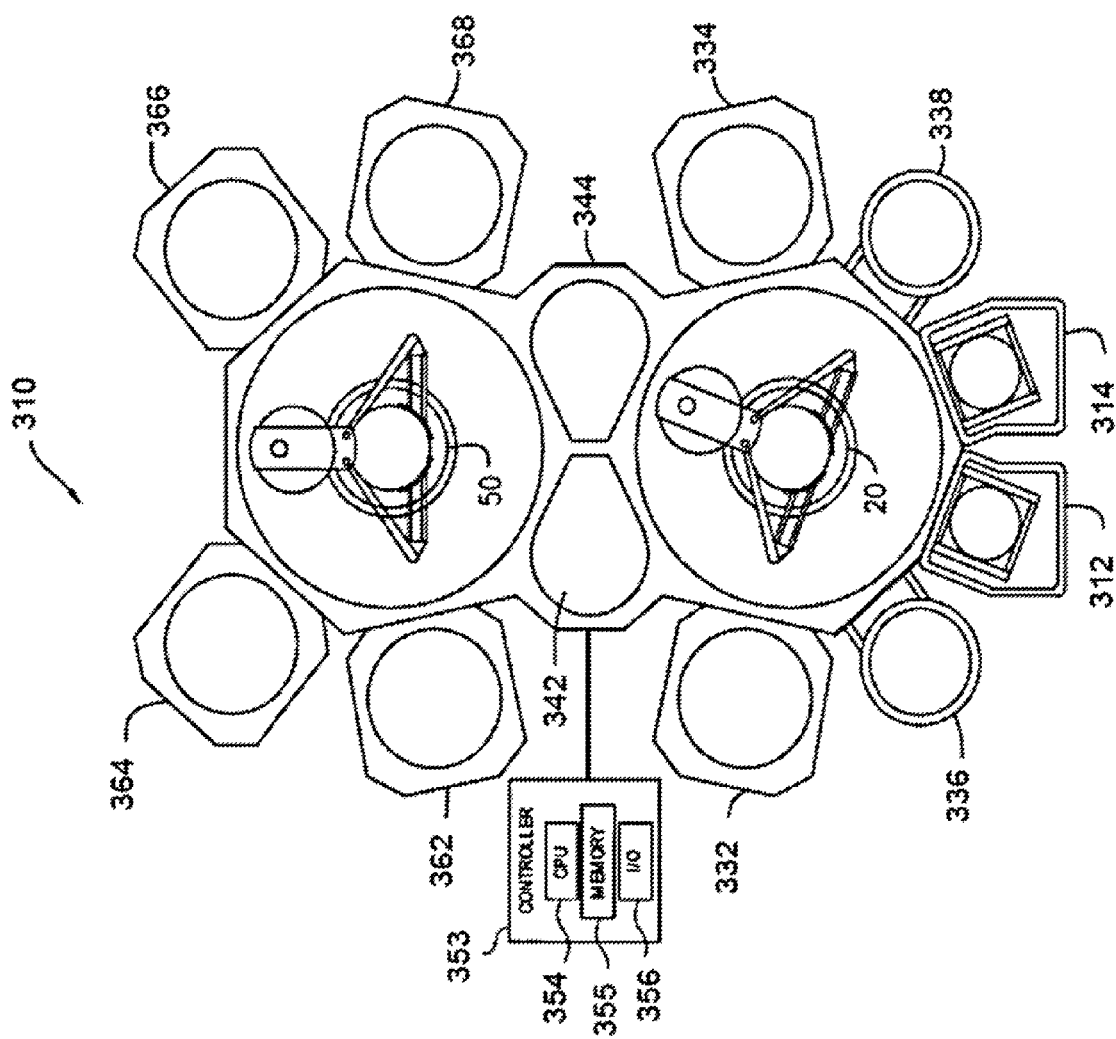
FIG. 3 illustrates a schematic of a cluster tool system in accordance with one or more embodiments of invention.

FIG. 3 shows an example of a cluster tool or multi-chamber processing system 310 that can be used in conjunction with an aspect of the invention. The processing system 310 can include one or more load lock chambers 312, 314 for transferring substrates into and out of the system 310. Typically, since the system 310 is under vacuum, and the load lock chambers 312, 314 may "pump down" substrates introduced into the system 310. A first robot 20 may transfer the substrates between the load lock chambers 312, 314, and a first set of one or more substrate processing chambers 332, 334, 336, 338. Each processing chamber 332, 334, 336, 338, may be configured to perform a number of substrate processing operations. For example, processing chamber 332 can be an etch processor designed to practice an etch process, and processing chamber 334 can be a deposition reaction chamber for performing ALD or CVD, or a rapid thermal processing (RTP) or RadOx® chamber designed to form a thermal oxide layer on a substrate. Processing chambers 336, 338 may also be configured to further provide, for example, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes.

The first robot 20 can also transfer substrates to/from one or more transfer chambers 342, 344. The transfer chambers 342, 344 can be used to maintain vacuum conditions while allowing substrates to be transferred within the system 310. A second robot 50 can transfer the substrates between the transfer chambers 342, 344 and a second set of one or more processing chambers 362, 364, 366, 368. Similar to processing chambers 332, 334, 336, 338, the processing chambers 362, 364, 366, 368 can be configured to perform a variety of substrate processing operations, including etch processes, in addition to cyclical layer deposition (CLD), atomic layer deposition (ALD), chemical vapor deposition (CVD), physical vapor deposition (PVD), epitaxial deposition, etch, pre-clean, chemical clean, thermal treatment such as RTP/RadOx®, plasma nitridation, degas, and orientation. Any of the substrate processing chambers 332, 334, 336, 338, 362, 364, 366, 368 may be removed from the system 310 if not needed.

By carrying out this process in a chamber on a cluster tool, surface contamination of the substrate with atmospheric impurities is avoided and a thin film of In(Ga)As can be provided without oxidation prior to depositing a subsequent metal film.

Applied Materials, Inc. of Santa Clara, Calif. offers a substrate processing chamber which includes a process called RadOx® to form thin silicon dioxide layers for CMOS transistor gates. The RadOx® process heats the substrate with lamps and injects hydrogen and oxygen into a process chamber. These gases form radicals when they strike the surface of the substrate. The radicals are more reactive than neutral species, providing a faster layer growth rate than would be available with steam processes known as In Situ Steam Generated (ISSG) oxide growth.

Suitable etch or clean chambers can be configured for wet or dry etch, reactive ion etch (RIE), or the like. Exemplary etch chambers include the SICONI™ Producer®, or Carina™ chambers, also available from Applied Materials, Inc. of Santa Clara, Calif. One non-limiting, exemplary dry etch process may include ammonia or ($NH_3$) or nitrogen trifluoride ($NF_3$) gas, or an anhydrous hydrogen fluoride (HF) gas mixture with a remote plasma, which condenses on $SiO_2$ at low temperatures (e.g., .about 30° C.) and reacts to form a compound which can be sublimated at moderate temperature (e.g., >100° C.) to etch $SiO_2$. Such an exemplary etch process can diminish over time and eventually saturate to a point where no further etching occurs unless portions of the compound are removed (for example, by the sublimation process described above). The etch process can be controlled using the above mechanism and/or by a timed etch process (e.g., etching for a predetermined period of time). Exemplary wet etch processes may include hydrogen fluoride (HF) or the like. Exemplary plasma or remote plasma etch processes may include one or more etchants such as carbon tetrafluoride ($CF_4$), trifluoromethane ($CHF_3$), sulfur hexafluoride ($SF_6$), hydrogen ($H_2$), or the like, and may be performed with or without a heating chuck.

In some embodiments, a process is performed including a first step in which the robot 20 moves a substrate from one of the load lock chambers 312, 314 to an etching chamber to etch a surface of the substrate. The substrate can be moved in a second step back into a load lock chamber 312, 314 or directly transferred to a deposition chamber to form an In(Ga)As layer of a predetermined thickness. After the In(Ga)As layer is deposited, the substrate can be moved in a second step back into a load lock chamber 312, 314 or directly transferred to a rapid thermal processing chamber to anneal the In(Ga)As layer or a deposition chamber to form a metal film. After depositing a metal film, the substrate can then be moved to other chambers for subsequent processing or can be moved to a load lock chamber 312, 214.

Controller 353 may be one of any form of general-purpose data processing system that can be used in an industrial setting for controlling the various subprocessors and subcontrollers. Generally, controller 353 includes a central processing unit (CPU) 354 in communication with memory 355 and input/output (I/O) circuitry 356, among other common components.

Figure 4:
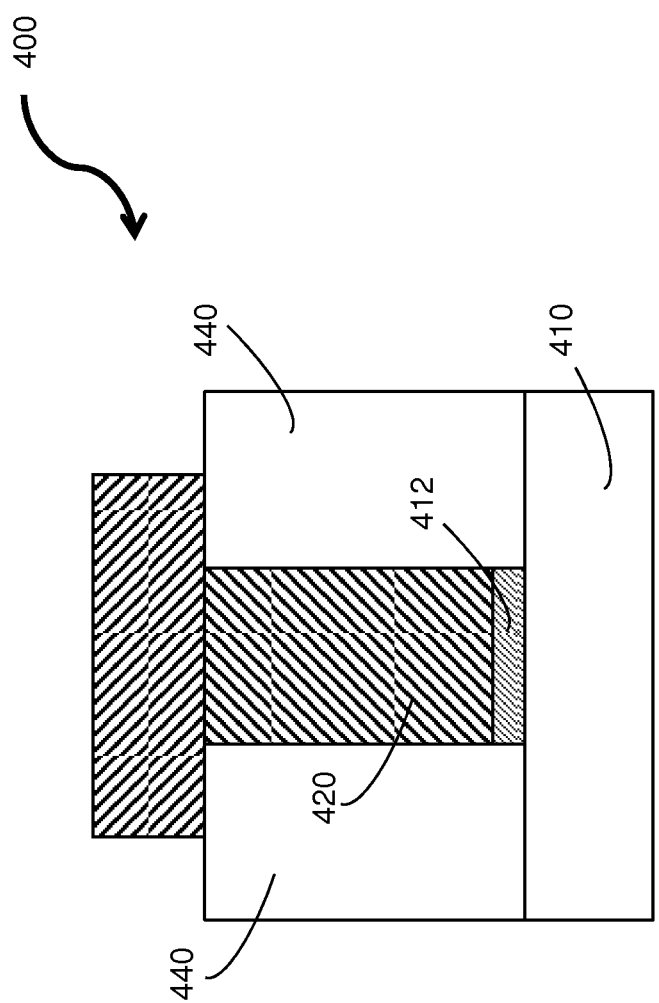
FIG. 4 illustrates an embodiment of a FET device in accordance with one or more embodiments of the invention.

FIG. 4 shows an exemplary embodiment of a FET device 400 that can be made in accordance with the methods and apparatus of the present invention. The device shown includes gate electrode (not shown) on gate dielectric layer (not shown) on a substrate, typically a silicon substrate or a silicon surface. Sidewall spacers (not shown) are disposed on laterally opposite sidewalls of the gate electrode. Source/drain regions 410 are on opposite sides of the gate electrode. According to one or more embodiments, interface layer 412 comprises a thin layer of In(Ga)As as described above, which lowers the contact resistivity of the interface between a metal contact layer 420 and the source/drain regions 410 of the silicon substrate. The contact layer 420 is formed in in an interlayer dielectric 440 coupled to the source and drain regions 410. Interface layers 412 can be formed using the methods and apparatus described above and have dimension as provided above.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A substrate processing apparatus comprising:
a first processing chamber to clean a substrate to provide a cleaned substrate, the first processing chamber performing an atomic hydrogen cleaning or cleaning with a fluorine-containing precursor;
a second processing chamber in communication with the first processing chamber to deposit a layer comprising indium arsenide on the cleaned substrate;
a third processing chamber in communication with the second processing chamber to deposit a metal layer on the layer comprising indium arsenide; and
a control system in communication with the first, second and third processing chambers, the control system configured to move the substrate from the first processing chamber directly to the second processing chamber and to deposit an indium arsenide layer directly onto the cleaned substrate in the second processing chamber,
wherein the first, second and third processing chambers are in communication under load lock conditions.

2. The apparatus of claim 1, wherein the second processing chamber is an atomic layer deposition (ALD) chamber, physical vapor deposition (PVD) chamber, chemical vapor deposition (CVD) chamber or molecular beam epitaxy (MBE) chamber.

3. The apparatus of claim 1, wherein the indium arsenide layer further comprises one or more of gallium, aluminum, antimony and phosphorus.

4. The apparatus of claim 1, wherein the third processing chamber is an ALD chamber.

5. The apparatus of claim 1, wherein the control system controls the second processing chamber to deposit a layer comprising indium arsenide having a predetermined thickness.

6. The apparatus of claim 5, wherein the predetermined thickness is in the range from about 0.5 nm to about 2 nm.

7. The apparatus of claim 5, wherein the predetermined thickness is selected to optimize contact resistivity with an underlying substrate surface.

8. The apparatus of claim 5, wherein the predetermined thickness is selected to provide a contact resistivity below $4 \times 10^{-9}$ ohm-cm$^2$.

9. The apparatus of claim 1, wherein the control system comprises a CPU and a computer-readable medium having stored thereon a set of machine-executable instructions that, when executed by the CPU, cause the apparatus to perform a method comprising:
cleaning a surface of the substrate to provide a cleaned substrate;
moving the cleaned substrate from the first processing chamber to a transfer chamber;
moving the cleaned substrate from the transfer chamber to the second processing chamber;
depositing a layer comprising indium arsenide on the cleaned substrate;
moving the substrate having the layer comprising indium arsenide thereon from the second processing chamber to a transfer chamber;
moving the substrate having the layer comprising indium arsenide thereon from the transfer chamber to the third processing chamber; and
depositing a metal layer on the layer comprising indium arsenide.

* * * * *